(12) United States Patent
Yen et al.

(10) Patent No.: US 11,026,008 B2
(45) Date of Patent: Jun. 1, 2021

(54) MICROPHONE AND TERMINAL DEVICE INCLUDING THE SAME

(71) Applicant: BEIJING XIAOMI MOBILE SOFTWARE CO., LTD., Beijing (CN)

(72) Inventors: Chiafu Yen, Beijing (CN); Hui Du, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/582,980

(22) Filed: Sep. 25, 2019

(65) Prior Publication Data

US 2020/0107095 A1 Apr. 2, 2020

(30) Foreign Application Priority Data

Sep. 27, 2018 (CN) .......................... 201811132720.8

(51) Int. Cl.
*H04R 1/08* (2006.01)
*H04R 3/00* (2006.01)
*H05K 1/18* (2006.01)

(52) U.S. Cl.
CPC .............. *H04R 1/083* (2013.01); *H04R 3/00* (2013.01); *H05K 1/189* (2013.01); *H05K 2201/10083* (2013.01)

(58) Field of Classification Search
USPC ....... 381/55, 74, 91, 92, 111, 122, 314, 355, 381/375
See application file for complete search history.

(56) References Cited

U.S. PATENT DOCUMENTS

2016/0219376 A1* 7/2016 Wang ..................... H04R 19/04

FOREIGN PATENT DOCUMENTS

| KR | 101346583 B1 | 1/2014 | |
| WO | 2007123293 A1 | 11/2007 | |
| WO | 2007123300 A1 | 11/2007 | |
| WO | WO 2007123293 | * 11/2007 | ............. H04R 19/04 |
| WO | 2016029378 A1 | 3/2016 | |

OTHER PUBLICATIONS

Extended European Search Report issued to EP Application No. 19199926.7 dated Feb. 18, 2020, (7p).
First Office Action issued to European Application No. 19199926.7, dated Feb. 9, 2021, (5p).

* cited by examiner

*Primary Examiner* — Yosef K Laekemariam
(74) *Attorney, Agent, or Firm* — Arch & Lake LLP

(57) ABSTRACT

The present disclosure provides a microphone and a terminal device. The microphone includes: a housing, a flexible circuit board, and a signal converter. The housing includes cavity with an open end; the flexible circuit board is connected to the housing to block the opening of the cavity. The signal converter disposed in the cavity is configured to convert a sound signal into an electrical signal and connected to the flexible circuit board.

14 Claims, 4 Drawing Sheets

MICROPHONE AND TERMINAL DEVICE INCLUDING THE SAME

CROSS REFERENCE TO RELATED APPLICATION

The present disclosure is based on and claims priority of Chinese Patent Application No. 201811132720.8, filed on Sep. 27, 2018, the entire content of which is hereby incorporated by reference.

TECHNICAL FIELD

The present disclosure relates to the field of terminal technologies, and in particular, to a microphone and a terminal device.

BACKGROUND

A terminal device serves to implement different functions through various modules, such as a microphone that implements voice communication. In order to ensure the stable operation of the terminal equipment, it is necessary to ensure the stable installation and connection of each module.

The microphone may include a printed circuit board including a rigid substrate. When the microphone is mounted, in order to ensure the stability of the module, the installation area should have sufficient installation space and flatness.

SUMMARY

The present disclosure provides a microphone and a terminal device to solve the deficiencies in the prior art.

A first aspect of the present disclosure provides a microphone including: a housing, a flexible circuit board, and a signal converter; the housing includes cavity with an open end; the flexible circuit board is connected to the housing to block the open end of the cavity; the signal converter disposed in the cavity is configured to convert a sound signal into an electrical signal and connected to the flexible circuit board.

A second aspect of the present disclosure provides a terminal device, including the microphone provided by the first aspect above.

The above general description and the following detailed description are intended to be illustrative and not limiting the present disclosure.

BRIEF DESCRIPTION OF DRAWINGS

The accompanying drawings, which are incorporated in and forms part of the specification, illustrate the examples consistent with the present disclosure, and serve to explain the principles of the present disclosure.

DETAILED DESCRIPTION

Examples will be described in detail herein, with illustrations thereof expressed in the accompanying drawings. When the accompanying drawings are involved, like numerals in the different drawings in the following description refer to like or similar elements unless otherwise indicated. The examples described in the following examples do not represent all embodiments consistent with the present disclosure. Instead, they are merely examples of devices and methods consistent with some aspects of the present disclosure as detailed in the appended claims.

Figure 1:
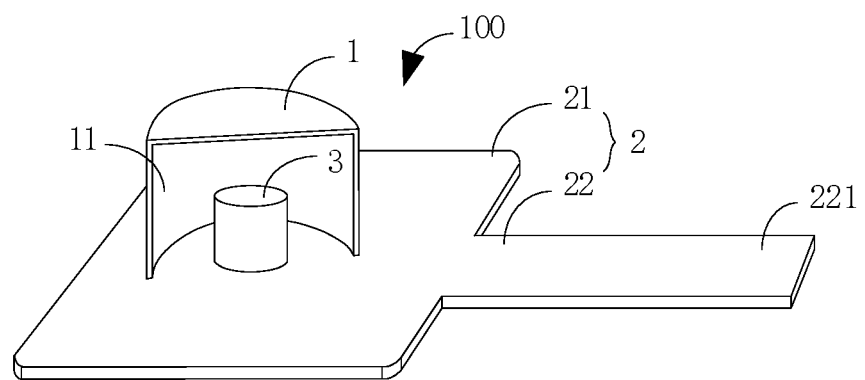
FIG. 1 is a schematic structural diagram of a microphone according to an example.

FIG. 1 is a schematic structural diagram of a microphone according to an example. As shown in FIG. 1, an example of the present disclosure provides a microphone 100 including a housing 1, a flexible circuit board 2, and a signal converter 3.

The housing 1 includes cavity 11 with an open end. The flexible circuit board 2 is connected to the housing 1 to block the open end of the cavity 11. The signal converter 3 disposed in the cavity 11 is configured to convert a sound signal into an electrical signal and connected to the flexible circuit board 2. The housing 1 may include a curved partial side wall and a flat top wall disposed on the curved partial side wall, which form a cavity 11 to house the signal converter 3.

For example, the cavity 11 of the housing 1 provides the signal converter 3 with a stable working space; the signal converter 3 is configured to receive a sound signal and convert the sound signal into an electrical signal; and the signal converter 3 is connected with the mounting area of the microphone and/or other modules of the terminal device through the flexible circuit board 2, so as to implement the fixation and connection of the microphone 100.

The flexible circuit board 2 has the characteristics of being bendable and flexible. When the microphone is mounted, through the flexible circuit board 2, the microphone 100 can be attached to a mounting area that is not flat enough, such as a mounting area having protrusions or depressions. Moreover, the flexible circuit board 2 can be bent, so that when the mounting area is not large enough, or when it is required to cooperate with other modules, the microphone can be mounted by bending the flexible circuit board 2. In the examples of the present disclosure, by using the flexible circuit board 2, installation requirement of the microphone is reduced, installation flexibility of the microphone is improved, and application range of the microphone is expanded.

In one or more examples, as shown in FIG. 1, the flexible circuit board 2 includes a supporting portion 21 and a connecting portion 22. The housing 1 and the signal converter 3 are attached to the supporting portion 21; the connecting portion 22 extends from one side of the supporting portion 21 and includes a free end 221 away from the supporting portion 21.

The supporting portion 21 can ensure stable installation of the signal converter 3, thereby ensuring proper function of the microphone.

Figure 2:
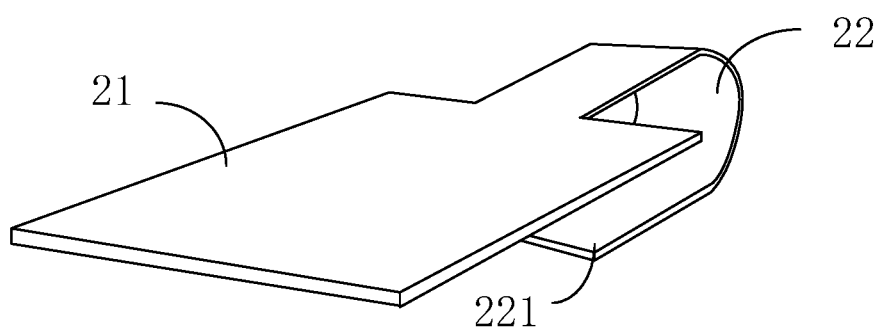
FIG. 2 is a schematic view showing a state of use of a flexible circuit board according to an example.

The free end 221 of the connecting portion 22 is configured to connect to other modules or components, for example, to a controller, so as to effectively control the microphone. By disposing the connecting portion 22, the microphone has more freedom in its place of installation. For example, the connecting portion 22 is able to cooperate with different distances between the signal converter 3 and the target connecting modules or components, so that the distances between the signal converter 3 and the target connecting modules or components have less impact on the installation of the microphone. FIG. 2 is a schematic diagram showing a state of use of a flexible circuit board according to an example. As shown in FIG. 2, the connecting portion 22 can be connected to the target connecting modules or components after being bent to meet different spatial and positional requirements.

In this example, by using the supporting portion 21 and the connecting portion 22, the microphone 100 has more freedom in its position of installation and manner of connection, thus making the microphone suitable for more installation scenarios. Moreover, by using the supporting portion 21 and the connecting portion 22, the microphone has larger application range. For example, for a terminal device with a bent structure, the bendable supporting portion 21 and the bendable connecting portion 22 may be attached fittingly to the bent structure, thus improving the cooperation of the microphone and other modules or components in the terminal device.

Figure 3:
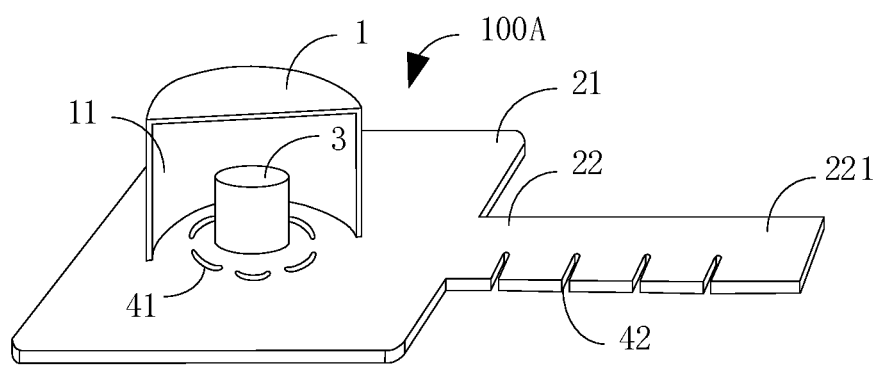
FIG. 3 is a schematic structural diagram of a microphone according to another example.

FIG. 3 is a schematic structural diagram of a microphone 100A according to another example. As shown in FIG. 3, a part of the supporting portion 21 corresponding to the cavity 11 is provided with first slits 41. The first slits 41 further improves flexibility of the supporting portion 21, so that the supporting portion 21 is more closely attached to an uneven mounting area, thereby ensuring mounting stability of the microphone 100A.

The number of the first slits 41 is not limited in the present disclosure. It is understood that the more first slits 41 there are, the stronger the flexibility of the supporting portion 21 is.

Regarding the manner of distribution of the first slits 41, in an example, as shown in FIG. 3, each of the first slits 41 is in an arc shape and the line connecting two adjacent first slits 41 is in an arc shape. In other words, the first slits 41 may be seen as distributed approximately on the same circle or ellipse to facilitate processing. In this way, the supporting portion 21 is easy to generate protrusion defamation or depression defamation to fit mounting areas of different shapes.

Figure 4:
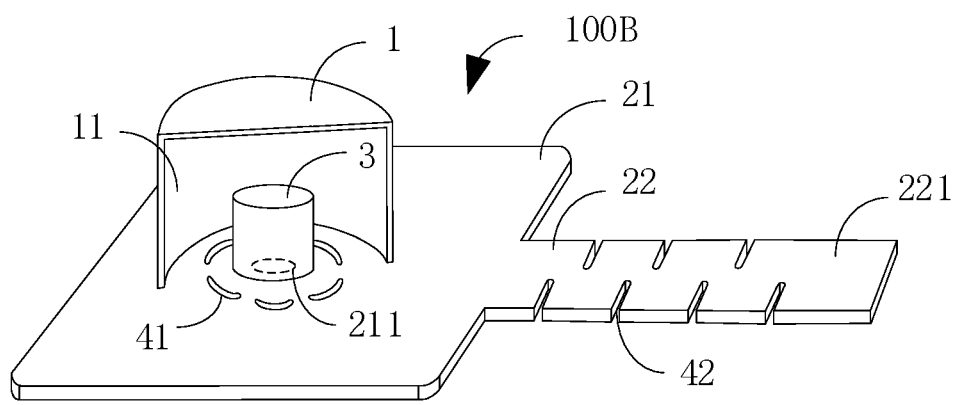
FIG. 4 is a schematic structural diagram of a microphone according to another example.

FIG. 4 is a schematic structural diagram of a microphone 100B according to another example. In this example, a sound receiving hole 211 of the microphone 100B is disposed on the flexible circuit board 2. As shown in FIG. 4, the supporting portion 21 is further provided with the sound receiving hole 211, and the first slits 41 are disposed around the sound receiving hole 211. In such a case, by providing the sound receiving hole 211 on the supporting portion 21, extensibility and flexibility of the supporting portion 21 are improved. For example, the supporting portion 21 may generate protrusion defamation or depression defamation with the sound receiving hole 211 as a center. Moreover, by disposing first slits 41 around the sound receiving hole 211, flexibility of the supporting portion 21 is further improved. In this way, the microphone is suitable for different installation requirements.

Figure 5:
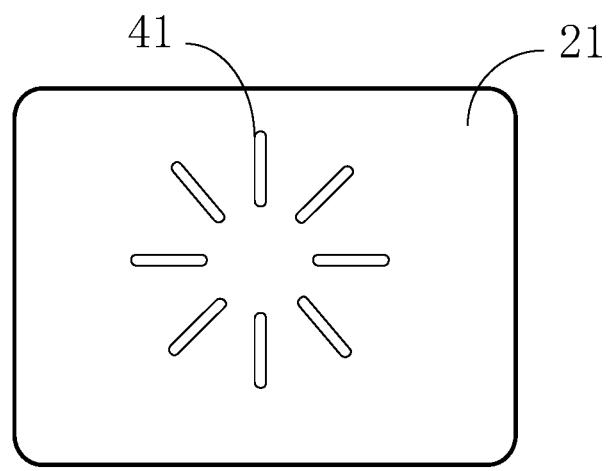
FIG. 5 is a schematic structural diagram of a supporting portion according to an example.

FIG. 5 is a schematic structural diagram of a supporting portion according to an example. In an example, when the sound receiving hole 211 of the microphone is disposed on the supporting portion 21, as shown in FIG. 5, the first slits 41 are diffusely distributed around a preset center. Disposing first slits 41 diffusely around the preset center also improves the flexibility of the supporting portion 21 and helps the supporting portion 21 to generate protrusion defamation or depression defamation with the preset center as vertex.

It is noted that the first slits 41 may be disposed on a side of the supporting portion 21 away from the housing 1 and the signal converter 3, and does not penetrate the supporting portion 21 in thickness direction. Since the side of the supporting portion 21 attached to the housing 1 and the signal converter 3 is disposed with wirings, solder joints, or the like, the first slits 41 are disposed on the other side of the carrier portion 21 away from the housing 1 and the signal converter 3, so that the disposition of the wirings and solder joints is not affected to facilitate production and processing.

In an example, as shown in FIG. 3, second slits 42 are disposed on the connecting portion 22. The second slits 42 helps the connecting portion 22 to be stretched or bent to meet different installation requirements. The second slits 42 may penetrate the connecting portion 22 in thickness direction of the connecting portion 22.

Alternatively, as shown in FIG. 3, second slits 42 are provided on a side of the connecting portion 22. It can be understood that the connecting portion 22 provided with the second slits 42 is more likely to be bent than in the case where the second slits 42 are not provided; and compared with a side where the second slit 42 are not provided, the side of the connecting portion 22 where the second slits 42 are provided has better stretchability.

In some examples, as shown in FIG. 4, the staggered second slits 42 are disposed on opposite sides of the connecting portion 22, which prevents a partial size of the connecting portion 22 to reduce abruptly, so that mechanical stability of the connecting portion 22 is ensured.

In some examples, second slits 42 are provided on a side of the connecting portion 22. When the connecting portion 22 is bent, the greatest deformation appears on the side, so providing the second slits 42 on the side of the connecting portion 22 contributes to improving bending deformation property of the connecting portion 22.

In some examples, the second slits 42 are disposed side by side along the length direction of the connecting portion 22 to help enhance the elasticity of the connecting portion 22. When the connecting portion 22 is stretched in the length direction of the connecting portion 22, the second slits 42 becomes wider and the connecting portion 22 becomes longer. In this case, when the microphone moves relative to modules or components connected thereto, the connecting portion 22 is still continuous, which effectively prevents connection breakage from affecting the proper function of the microphone.

It is noted that when the second slits 42 are provided on the connecting portion 22, structures like wiring or solder joint on the connecting portion 22 should be avoided, so as to ensure proper function of the flexible circuit board 2.

In some examples, the first slits 41 and the second slits 42 have arc-shaped ends and may be shaped in an ellipse, for example. Arc-shaped ends reduce stress concentration at the ends of the slits 41 and 42, and prevent the flexible circuit board 1 from being torn at the slits 41 and/or 42, thereby ensuring the safety of the terminal device.

Figure 6:
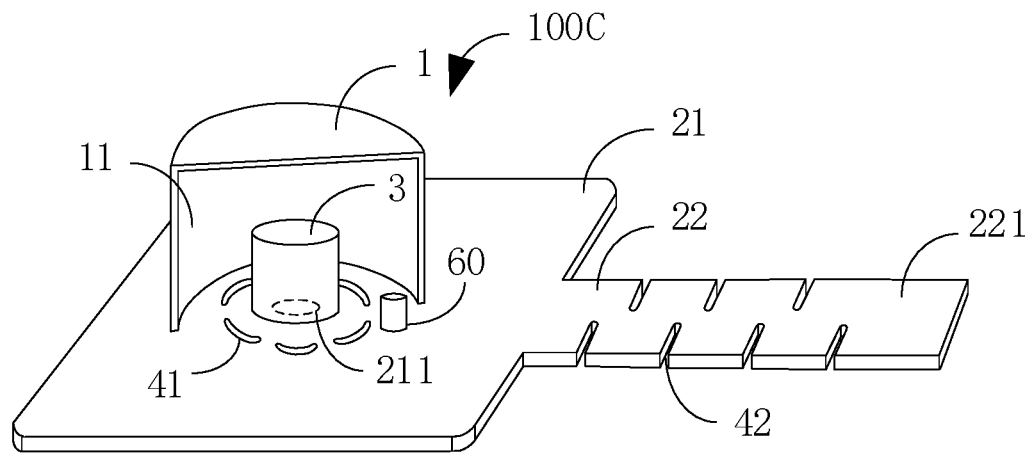
FIG. 6 is a schematic structural diagram of a microphone according to still another example.

In an example, as shown in FIG. 6, the microphone 100C includes a signal converter 3. The signal converter 3 includes a Micro-electro-mechanical Systems (MEMS) sensor, and an integrated circuit chip 60 that is electrically connected to the MEMS sensor. The integrated circuit chip 60 is connected to the flexible circuit board 2, and includes components with ring-shaped structures, such as resistors, capacitors, and the like. Compared with a straight-line structure, the ring-shaped structure reduces length and width of the component, enabling the integrated circuit chip 60 to be with a smaller size and reducing overall installation space required by the microphone.

An example of the present disclosure further provides a terminal device including the above microphone. Since the above microphone is suitable for various installation requirements, when assembling the terminal device, there are less restrictions regarding relative positions and manners of connection of different modules, and more manners of installation available, so that users' demands are better satisfied.

Figure 7:
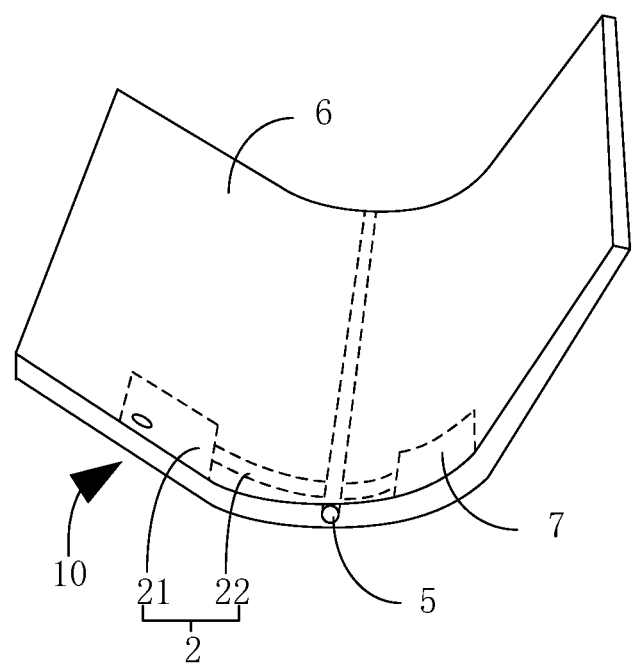
FIG. 7 is a schematic structural diagram of a terminal device according to an example.

FIG. 7 is a schematic structural diagram of a terminal device according to an example. In an example, as shown in FIG. 7, the terminal device includes a display screen 6 that can be bent along a preset shaft 5. The flexible circuit board 2 in the microphone 10 includes a supporting portion 21 and a connecting portion 22, and a free end 221 of the supporting portion 21 and the connecting portion 22 are respectively disposed on two sides of the preset shaft 5. The microphone 10 may be any one of the above example microphones 100, 100A, 100B, or 100C.

In some examples, the supporting portion 21 is disposed at a portion that does not need to be bent, so that stability of the housing 1 and the signal converter 3 is ensured. With the disposition of the free end 221 of the connecting portion 22 across the preset shaft 5, the microphone is connected to other modules or components. In this way, the cooperation of the microphone and other modules is achieved and proper function of the terminal device is ensured. When the microphone provided by examples of the present disclosure is applied to a terminal device with a bending screen, the microphone may function properly and stably while the bending property is maintained.

For example, the terminal device further includes a controller 7. The controller 7 and the signal converter 3 of the microphone are respectively disposed at two sides of the preset shaft 5, and the controller 7 is electrically connected to the free end 221. The microphone is connected electrically to the controller 7 through the connecting portion 22 across the preset shaft 5, so that the controller 7 may control the microphone. It can be seen from the above examples that internal modules of the terminal device may be flexibly installed and various manners of installation may be achieved to meet satisfy users' demands. In addition, assembly difficulty is also reduced.

The preset shaft 5 may be a rotating shaft in the display screen 6; or the preset shaft 5 may be an axis and thus the display screen 6 may be folded around the preset shaft 5. In the examples of the present disclosure, implementation of the preset shaft 5 is not specifically limited.

In addition, in examples of the present disclosure, type of the terminal device is not specifically limited. For example, the terminal device includes a mobile phone, a computer, a laptop, a digital broadcast electronic device, a game console, a tablet device, a medical device, a fitness device, a personal digital assistant, and the like.

Other embodiments of the present disclosure will be apparent to those skilled in the art after considering the specification and what disclosed herein. The present disclosure is intended to cover any variations, uses, or adaptations of the present disclosure, which are in accordance with the general principles of the disclosure and include common general knowledge or common technical means in the art that are not disclosed in the present disclosure. The specification and examples are to be regarded as illustrative only, and the true scope and spirit of the present disclosure are indicated by the appended claims.

It is to be understood that the disclosure is not limited to the details described and expressed in the accompanying drawings and is subject to changed and variations within its scope. The scope of the disclosure is to be limited only by the appended claims.

What is claimed is:

1. A microphone, comprising:
   a housing including a cavity having an open end;
   a flexible circuit board, connected to the housing to block the open end of the cavity; and
   a signal converter, configured to convert a sound signal into an electrical signal, disposed in the cavity, and connected to the flexible circuit board;
   wherein the flexible circuit board comprises:
   a supporting portion, connected to the housing and the signal converter; and
   a connecting portion, extending from a side of the supporting portion, and comprising a free end away from the supporting portion and the housing.

2. The microphone according to claim 1, wherein a part of the supporting portion corresponding to the cavity is provided with first slits.

3. The microphone according to claim 2, wherein each of the first slits is in an arc shape.

4. The microphone according to claim 2, wherein
   the supporting portion is further provided with a sound receiving hole, and
   the first slits are distributed around the sound receiving hole.

5. The microphone according to claim 1, wherein the connecting portion is provided with second slits.

6. The microphone according to claim 5, wherein the second slits staggered are disposed on opposite sides of the connecting portion.

7. The microphone according to claim 5, wherein the second slits are disposed on a side of the connecting portion.

8. The microphone according to claim 7, wherein the second slits are disposed side by side along a length direction of the connecting portion.

9. The microphone according to claim 2, wherein the first slits are diffusely distributed around a preset center.

10. The microphone according to claim 2, wherein the first slits are disposed on a side of the supporting portion away from the housing and the signal converter, and do not penetrate the supporting portion in a thickness direction of the supporting portion.

11. The microphone according to claim 1, wherein
    the signal converter further comprises an integrated circuit chip; and
    the integrated circuit chip is connected to the flexible circuit board and comprises components with a ring-shaped structure.

12. A terminal device, comprising a microphone;
    wherein the microphone comprises:
    a housing including a cavity having an open end;
    a flexible circuit board, connected to the housing to block the open end of the cavity; and
    a signal converter, configured to convert a sound signal into an electrical signal, disposed in the cavity, and connected to the flexible circuit board; and
    wherein the flexible circuit board comprises:
    a supporting portion, connected to the housing and the signal converter; and
    a connecting portion, extending from a side of the supporting portion, and comprising a free end away from the supporting portion and the housing.

13. The terminal device according to claim 12, wherein
   the terminal device comprises a screen bendable along a preset shaft; and
   the free end of the supporting portion and the connecting portion are respectively disposed on two sides of the preset shaft.

14. The terminal device according to claim 13, further comprising a controller;
   wherein the controller and the signal converter of the microphone are respectively disposed at two sides of the preset shaft, and the controller is electrically connected to the free end.

\* \* \* \* \*